United States Patent [19]

McBrien

[11] Patent Number: 4,556,850
[45] Date of Patent: Dec. 3, 1985

[54] SERIAL TO PARALLEL DATA CONVERSION CIRCUIT

[75] Inventor: Gregory J. McBrien, Portland, Conn.

[73] Assignee: United Technologies Corporation, Hartford, Conn.

[21] Appl. No.: 438,115

[22] Filed: Nov. 1, 1982

[51] Int. Cl.[4] .......................................... H03K 17/00
[52] U.S. Cl. ........................................ 328/72; 377/54
[58] Field of Search ...................... 377/72, 81, 116, 54, 377/55, 56; 331/DIG. 2, DIG. 3; 328/129.1; 307/603, 608

[56] References Cited

U.S. PATENT DOCUMENTS

| | | | |
|---|---|---|---|
| 2,519,184 | 0/1950 | Grosdoff | 377/107 |
| 3,146,345 | 0/1964 | Conover, Jr. | 377/54 |
| 3,764,782 | 0/1973 | Spauszus et al. | 377/54 |
| 4,323,851 | 0/1982 | Shedd et al. | 328/72 |
| 4,425,514 | 0/1984 | Orr et al. | 307/603 |

*Primary Examiner*—John S. Heyman
*Assistant Examiner*—K. Ohralik
*Attorney, Agent, or Firm*—Dominic J. Chiantera

[57] ABSTRACT

Serial to parallel conversion circuitry achieves phase synchronization and signal bit sampling of received asynchronous serial data through use of a gate enable delay line oscillator having a selected response time, and selectably enabled in the presence of the received serial data to provide a sampling clock signal for shifting the serial data into register for parallel formatting at a frequency equal to the line frequency.

4 Claims, 3 Drawing Figures

SERIAL TO PARALLEL DATA CONVERSION CIRCUIT

DESCRIPTION

TECHNICAL FIELD

This invention relates to asynchronous digital signal receivers, and more particularly to serial bit-to-parallel bit conversion circuitry for use in asynchronous digital signal receivers.

BACKGROUND ART

The common format for digital signal data transmission between remote stations is by serial bit transmission over a single wire. The signal information is transmitted in serial bit frames, each including a selected N number of serial bits preceded by a first START bit signaling the beginning of the frame. The serial bits are transmitted at a selected line frequency established by the transmitting station. When the transmitting station clock signal is not transmitted to the receiving station the data transmission is asynchronous.

The receiving station signal data systems typically operate on parallel formatted data so that the received serial data must first be reassembled in parallel. The serial-to-parallel conversion is done with shift registers. The received serial data bits are strobed serially in each frame into the shift register at a sampling frequency established by a local oscillator. The strobing in of the data must occur at the same rate as the line frequency to avoid losing data bits, so that the sampling frequency must be equal to and phase synchronized with the line frequency.

The receiver local oscillator is phase synched to the incoming line frequency by detecting the presence of each frame's START bit. This is provided by detecting the logic state transition associated with each START bit. In the prior art Universal Asynchronous Receiver/Transmitter (UART) the START bit transition is evidenced by detection of the leading edge with a higher than line frequency clock, e.g. a "16 X clock" which samples the received data line at 16 times the line frequency. The leading edge is located to within one clock sample interval at the point at which the samples change state. Maintenance of the logic state change for a selected time interval (e.g. one half the bit time interval for return to zero (RZ) signals) assumes a valid START bit. Thereafter a counter is enabled which counts down the higher (16 X) clock signal to the line frequency rate to produce a sampling clock frequency which samples the incoming data once per bit cell. The phase of the divided down sample clock signal is adjusted, based on the START bit edge location to provide sampling of each data bit more or less at the center of its information state. For RZ signal formats this occurs at a quarter bit cell time.

With a 16 X clock the START bit edge location error is one in 16, or 6.3 percent. The error may be made smaller by using a higher frequency, e.g. 32 or 64 X. Obviously higher edge sampling rates require faster edge detection circuitry. For incoming line frequencies on the order of 10 MHZ a 16 X clock equals 160 MHZ; a 32 X clock twice that frequency, and so on. However, for optical data line frequencies (e.g. high frequencies typically on the order of 50 MHZ or more) it is impractical to use line receivers employing higher than line frequency clock interfaces.

DISCLOSURE OF INVENTION

The object of the present invention is to provide serial-to-parallel conversion of asynchronous serial digital signal data without use of a higher than line frequency clock interface.

According to the present invention, serial to parallel conversion circuitry achieves phase synchronization and signal bit sampling of received asynchronous serial data through use of a gate enable delay line oscillator having a selected response time, and selectably enabled in the presence of the received serial data to provide a sampling clock signal for shifting the serial data into register for parallel formatting at a frequency equal to the line frequency. In further accord with the present invention, oscillator control circuitry provides gate enable and gate disable signals to the oscillator to selectably enable and inhibit operation of the oscillator, the control circuitry providing gate enable signals in the interval associated with a present data frame as represented by the time interval following the presence of a valid START bit simultaneous with absence of a last data bit, the control circuitry providing a gate disable signal at all other times. In still further accord with the present invention, the oscillator control circuit includes a bistable latching device operable in a first state and a second state for providing the gate enable and gate disable signals, respectively, to the oscillator, the bistable device being setable in the first state in response to the presence of a selected minimum cell time START bit and being resetable to the second state in response to the presence of a detected last data bit. In still further accord with the present invention, the local oscillator comprises a series combination of a dual input inverting gate and a delay line connected in a regenerative closed loop through one input of the gate, the second input of the gate being responsive to the gate enable and gate disable signals from the control circuitry, the gate delay in summation with the delay line time constant equaling one half the line frequency period.

The serial-to-parallel converter of the present invention provides conversion of high speed serial data without the use of a higher than line frequency local oscillator. The prior art 16 X local oscillator is no longer required to achieve phase synchronization with the received data. Instead the data detection circuitry uses a bistable latching device with a selected, delayed clock signal derived from the incoming data to detect a valid START bit and, in response, provide enablement of the conversion circuit local oscillator. The local oscillator, when enabled, provides data frame synchronization of the converter circuit with each incoming data bit of the data frame.

These and other objects, features and advantages of the present invention will become more apparent in light of the following detailed description of a best mode embodiment thereof, as illustrated in the accompanying Drawing(s).

BRIEF DESCRIPTION OF DRAWING(S)

BEST MODE FOR CARRYING OUT THE INVENTION

Figure 1:
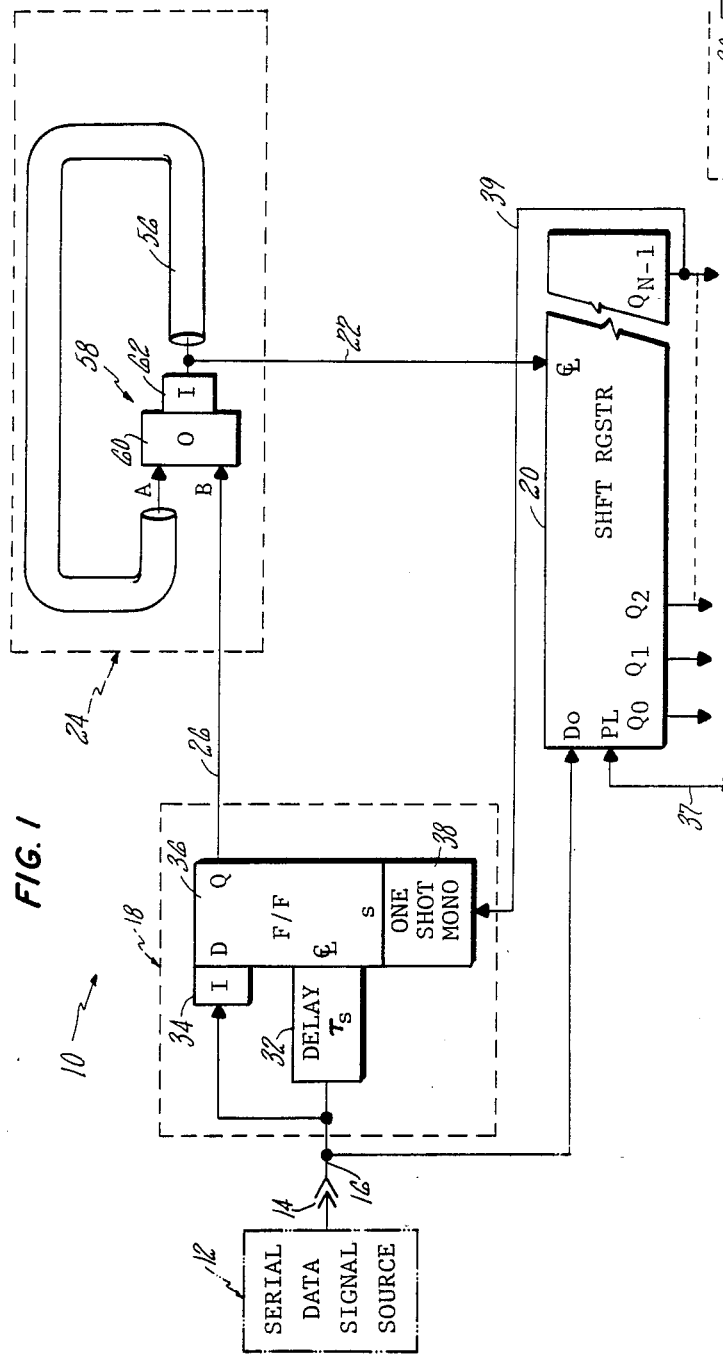
FIG. 1 is a block diagram illustration of a serial-to-parallel converter according to the present invention.

Referring now to FIG. 1, the present serial-to-parallel converter 10 receives serial digital bit signal information from a signal source 12 at an input port 14. The signal source is illustrated in phantom; it is not part of the converter circuit. It is, however, the serial data source and may alternately comprise the input interface circuitry of a UART, or in a high speed optical data receiver it may comprise the transducer circuitry for converting the received serial bit optical signal information into equivalent high speed electrical signal bits.

The received data at port 14 is presented through lines 16 to the input of local oscillator control circuitry 18 and to the input of a serial-to-parallel shift register 20. The shift register, which is a type known in the art, receives the incoming serial data on line 16 and shifts each bit serially into register on each succeeding clock pulse provided on line 22 from the conversion circuit local oscillator 24. The register may include a number of shift registers in cascade to provide the required N bit frame storage with parallel output bits $Q_0$-$Q_{N-1}$. In a high speed configuration (line frequencies greater than 30 MHZ) the register comprises high speed logic, such as emitter coupled logic (ECL) or other speed equivalent logic having similar response times. The exact type logic used is based on the particular application line frequency, and the choice is one which may be made by those skilled in the art.

The oscillator control circuitry 18 provides selective operation of the local oscillator 24. It enables the oscillator only for the interval of time coincident with the presence of an incoming data frame. The control circuit provides an enabling gate signal on a line 26 to the oscillator upon detection of a valid START bit; the first bit of the incoming data frame. This provides start-up of the oscillator. The detection of the START bit of each incoming data frame is performed by the oscillator control circuitry including a $T_s$ delay line 32, an INVERT (I) gate 34, and clock triggered bistable device 36. The delay line, of a type known in the art, is connected with invert gate 34 to the incoming data line 16. The output of the invert gate is connected to the data input of the bistable device and the delay line output is connected to the bistable device clock input. In the FIG. 1 embodiment the bistable device 36 is shown as a D input, edge triggered flip-flop. The Q output from the bistable is connected through line 26 to the local oscillator 24.

In addition, the control circuit includes a triggered pulse generator 38, such as a one shot monostable device connected at its input through line 39 to the $Q_{N-1}$ output bit location of the shift register and at its output to the SET (S) input of the flip-flop 36. A pulsed logic one signal from the monostable sets the flip-flop Q output to a logic one state where it remains latched until a D input zero state signal is clocked in by the input clock signal from the $\tau_s$ delay line 32. The monostable input is responsive to an end of frame (EOF) discrete signal, such as that provided by detection of the presence of the present data frame START bit being shifted into the last, or $Q_{N-1}$ position of the shift register. Since the register operates on a first-in first-out (FIFO) basis, the register parallel bit output is cleared to zero between frames by a PL discrete signal provided on line 37 from associated user apparatus and the START bit logic state is fixed, its appearance in the $Q_{N-1}$ bit position indicates an EOF. This triggers the one shot monostable which sets the flip-flop Q output to the logic one disabling (turning off) the local oscillator.

Figure 2:
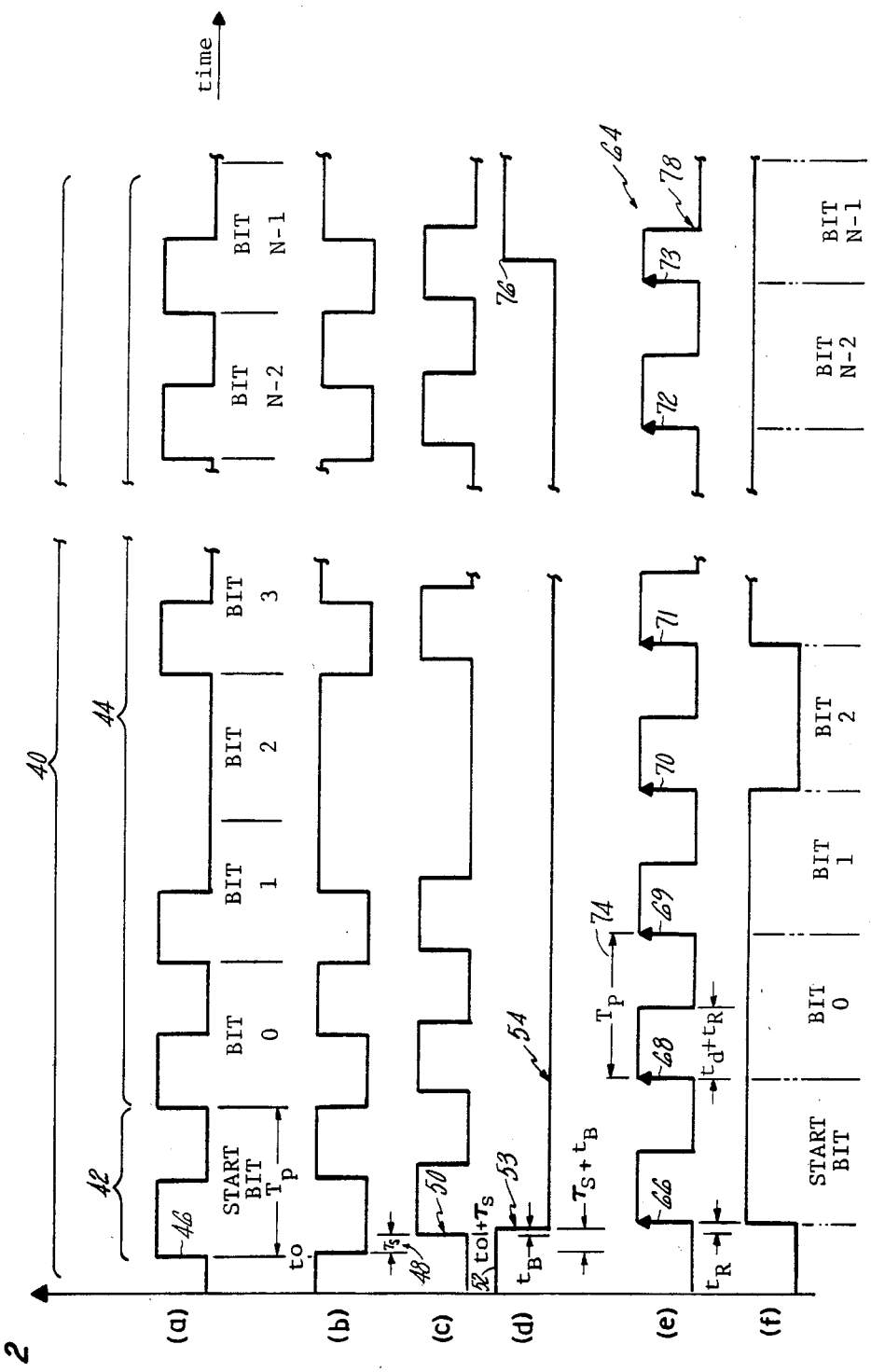
FIG. 2 is an illustration of a family of waveforms used in the description of the embodiment of FIG. 1.

Referring now to FIG. 2, illustration (a) shows a data frame 40 having a START bit 42 followed by an N number of data bits 44 (bit zero-bit N-1). The received serial data is in a return to zero (RZ) format with a bit cell time equal to $T_P$. One-half the cell time ($T_{P/2}$) includes the bit cell information followed by the remaining half "return to zero". Illustration (b) shown the invert gate 34 output waveform presented to the D input of the bistable device 36. Illustration (c) represents the $\tau_s$ delayed clock signal to bistable device 36. The START bit leading edge 46 (illustration (a)) appears at time $t_0$ and is delayed by a $\tau_s$ delay interval (48) to provide a delayed clock signal (50) at time $t_0+\tau_s$ to the bistable device. Since the bit information for the RZ is in the first half of the bit cell time, centered at the quarter period (e.g. $T_{P/4}$), the $\tau_s$ delay time constant value is approximately: $\tau_s \cong (T_{P/4})-(t_B+t_R)$, where $t_B$ is the bistable device response time and $t_R$ is the response time of the oscillator gate The D input to the bistable receives the inverted (INVERT gate 34 output) data (FIG. 2, illustration (b)) so that the delayed clock signal strobes an inverted START bit logic state, or logic zero at time $t_0+\tau_s$. The bistable Q output (illustration (d)) transitions from a logic one state 52 (gate disable signal) to a logic zero state 54 (gate enable signal) at time $t_0+\tau_s+t_B$.

Referring again to FIG. 1, the local oscillator 24 comprises delay line 56 and gated amplifier device 58 and is a feedback type oscillator; the feedback provided through the delay line 56 coupled (from output to input) around the signal inverting, gated amplifier device 58. The gated amplifier has dual signal inputs A, B connected to the delay line 56 and to the line 26 gate signal input from the control circuit 18. The gated amplifier is a logic device which is inhibit sensitive. In FIG. 1 the gated amplifier comprises a combination OR gate 60 whose output is connected through an INVERT gate 62 to the oscillator output line 22. The gate device B signal input is responsive to the oscillator control circuit gate signals. The gate signal input inhibits oscillator operation in the presence of a gate disable signal (a logic one state in the embodiment of FIG. 1) and allows unrestricted oscillator operation in the presence of a gate enable signal (logic zero state, FIG. 2, illustration d). The combination functions as a NOR gate which, as known by its truth table characteristic, maintains a zero output (inhibit) in response to a steady state logic one state at one input, and provides inversion of the second input signal in the presence of a steady state logic zero at the remaining input. Various other known gate devices having similar truth table characteristics may be used, all of which is known to those skilled in the art. The gated amplifier responds within response time $t_R$ to the bistable Q output signal transition at input B from a disable to an enable state. The amplifier output (line 22) transitions to a logic one (66, FIG. 2, illustration (e)) since input A is zero. The amplifier output pulse propagates around the feedback path in oscillator delay line time $t_d$, appears at input A and is inverted within time $t_R$ at the amplifier output. Since data is shifted into register 20 on each rising edge (66–73, FIG. 2, illustration (e)) two oscillator cycles are required for each clock cycle. Therefore, the oscillator period is equal to the sum $t_R+t_d$, which in turn is approximately equal to $T_{P/2}$ (half the line frequency period).

In the embodiment of FIG. 1 the delay line 56 comprises a length of coaxial cable, i.e. a coaxial delay line. The coaxial line is preferably RG187 50 ohm coax selected for its high corrolation accuracy between cable length and signal propagation time. This allows accurate setting of the delay line time constant. The actual length of the coaxial line is trimmed to set the desired oscillator delay time constant ($T_{P/2}$).

The logic type used for the gated amplifier 58 depends, as does that used for the shift register 20 and control circuit 18, on the particular line frequency of the application. For precision local oscillator frequency the amplifier response time (in the FIG. 1 embodiment the combined response times for OR gate 60 and INVERT gate 62) must be small; less than 20% of the oscillator delay time constant. For a 50 MHZ line frequency with $T_P$ equal to 20 nanoseconds the local oscillator delay time constant is 10 nanoseconds; the response time of the gate circuit should be less than 2 nanoseconds. For emitter coupled logic (ECL) the response time is nominally 1.2 nanoseconds.

FIG. 2, illustration (e) shows the oscillator output waveform 64. The first clock pulse 66 following the enable signal edge (53) is delayed by the inverting gate amplifier response time $t_R$. The clock signal 66 strobes the line 16 START bit 42 into register location $Q_0$. Each succeeding clock pulse (68–73) strobes each incoming serial data bit at $T_P$ intervals (74); each at the center of the active data portion of each bit cell ($T_{P/4}$ of each cell interval). Upon completion of the strobe for the Nth bit the register $Q_{N-1}$ bit location receives the START bit. This causes the $Q_{N-1}$ bit to transition from the cleared register zero bit state to the START bit logic one state, which is coupled through line 39 to the input of the monostable 38 of control circuit 18. The monostable responds with an interval pulse to the bistable SET input causing the Q output to transition to a logic one (gate disable) state 76 (FIG. 2, illustration (d)). This resets the oscillator output (line 22) to a zero (78, illustration (e)); inhibiting the oscillator unit appearance of the next succeeding valid START bit.

As described, oscillator control circuitry 18 controls oscillator operation as a function of the presence of received data. This is evidenced as the interval between detection of a valid START bit and detection of the presence of the last (Nth) bit in register 20. The control circuit must necessarily obtain phase synchronization prior to enabling the oscillator. This is provided by the bistable latching function in which delaying the clock signal to the bistable device by a selected fraction of a bit cell time together with inverting the data input to the bistable. As such the delayed clock signal (which is a logic one transition of the input data) clocks in a zero logic state input and the Q output remains constant. However, if noise appears on the line 16 the noise spike propagates through delay line 32 and clocks the bistable at the $\tau_S$ interval, after the noise pulse has disappeared. If at the time of the noise pulse the D input is at a logic one the Q output will transition to a logic one state in response to the noise clock pulse, thereby inhibiting the oscillator operation prematurely.

Figure 3:
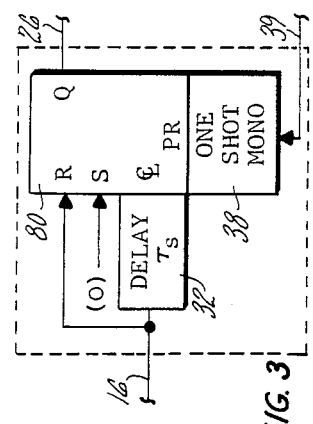
FIG. 3 is a block diagram illustration of an alternate configuration for one element used in the embodiment of FIG. 1.

Various bistable inhibiting schemes may be used to prevent this. The existance of a "clock inhibit" input on some bistable devices allows use of the $\overline{Q}$ output signal to control the clock inhibit, providing absolute noise immunity during the data frame presence. Alternatively, a different type of flip-flop may be used, such as a SET/RESET type. FIG. 3 illustrates the oscillator control circuit with a SET/RESET bistable device 80. As shown the data on line 16 presented directly to the RESET (R) input of the S/R device. The $\tau_S$ delay line 32 delays the data to the clock input of the bistable, and the output of the monostable 38 is presented to the S/R PRESET input. The SET (S) input is tied low. At time $t_o$ with the Q output at a logic one, a logic one START bit latches the Q output low (logic zero gate enable) on line 26. Subsequent RESET one inputs do not change the output thereby immunizing against noise input. An EOF from the register pulses the monostable which presets the S/R to a logic one Q output, disabling the oscillator.

The present invention provides converter phase synchronization with the asynchronous serial input data and conversion of this data to a parallel format, all with the use of a single oscillator operating at the received data line frequency. This is made possibly by use of a gated feedback oscillator having a short, repeatable turn-on delay time which allows immediate synchronization of the local oscillator clock with the incoming data stream.

The present serial-to-parallel converter may be used in high speed optical systems operating at several hundred megaherz line frequencies, for in excess of the maximum frequency of operation of the conventional, prior art 16 X type receivers. The conversion circuit may be fabricated with contemporary high speed logic family devices, such as ECL. However, any other suitably high speed logic devices, now developed or available in the future may be used, with selection based on a selected ratio of gated amplifier response time to the oscillator delay line time constant. Similarly, the gated oscillator may use any suitable delay line element; the oscillator configuration itself not being limited to the use of a coaxial delay line.

Similarly, although the invention has been shown and described with respect to a preferred embodiment thereof, it should be understood by those skilled in the art that various other omissions, changes, and additions may be made therein without departing from the spirit and scope of the invention.

Having thus described a preferred embodiment of my invention, that which I claim and desire to secure by Letters Patent is:

1. Apparatus for converting to parallel bit format asynchronous serial bit digital signals received at a line frequency in successive frames, each frame beginning with a START bit and ending with a last data bit, each bit having a bit cell time, comprising:
   register means responsive to a clock signal for receiving the serial bit digital signals at a serial bit input thereof and shifting the serial bits in each frame to a parallel bit output thereof sequentially from the START bit to the last data bit in dependence on said clock signal and providing an end of frame signal indicative of the presence of the last data bit in said register means;
   gated oscillator means receiving, alternately, a gate enable signal and a gate disable signal at a gate signal input thereof, for providing, at a frequency substantially equal to the line frequency, said clock signal in the presence of said gate enable signal;
   as characterized by oscillator control means comprising;
   inverter means for receiving the digital signals at an input thereof and providing inverted digital signals at an output thereof, time delay means for receiving the digital signals at an input thereof and providing the digital signals to an output thereof after a delay of a selected portion of the bit cell time, bistable latching means for receiving said inverted digital signals at a data input thereof, receiving said time delayed digital signals at a clock input thereof, and receiving said end of frame signal at an asynchronous input thereof, said bistable latching means providing said gate enable signal when each signal transition of said delayed digital signal occurs during a selected level of said inverted signal, said bistable latching means providing said gate disable signal in the presence of said end of frame signal.

2. The apparatus of claim 1, wherein said gated oscillator means comprises:

delay line means, having input and output ports for providing a selected signal propagation delay time constant to signals propagating therethrough; and gated amplifier means, having said gate signal input and having a feedback signal input connected, respectively, to said oscillator control means and to said output port of said delay line means, and having a signal output connected to said register means and to said input port of said delay line means, said gated amplifier means, in combination with said delay line means providing a regenerative closed loop for responding to signals propagating through said delay line means in the presence of said gate enable signal for providing said clock signal to said register means at said selected line frequency rate.

3. The apparatus of claim 2, wherein said gated amplifier means provides the inverted signal form of each signal received at said feedback signal input, each inverted signal provided at said gated amplifier output at a maximum response time interval, said maximum response time interval in summation with said delay line means propagation delay time constant being equal to one-half the selected line frequency time period.

4. The apparatus of claim 2, wherein said delay line means comprises a coaxial cable delay line.

* * * * *